(12) United States Patent
Khoury et al.

(10) Patent No.: US 6,452,407 B2
(45) Date of Patent: Sep. 17, 2002

(54) PROBE CONTACTOR AND PRODUCTION METHOD THEREOF

(75) Inventors: Theodore A. Khoury, Evanston; Mark R. Jones, Mundelein; R. Keith Lee, Barrington, all of IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/740,179

(22) Filed: Dec. 18, 2000

Related U.S. Application Data

(63) Continuation-in-part of application No. 09/099,614, filed on Jun. 19, 1998, now abandoned.

(51) Int. Cl.⁷ .......................... G01R 31/023; H01L 23/48
(52) U.S. Cl. .......................... 324/754; 324/761; 257/696
(58) Field of Search .............................. 324/754, 761, 324/758, 765, 762, 72.5; 29/843, 840, 844, 845; 257/780, 781, 782, 783, 784, 696, 692, 693, 697, 727

(56) References Cited

U.S. PATENT DOCUMENTS

| | | | | | |
|---|---|---|---|---|---|
| 4,922,376 | A | * | 5/1990 | Pommer et al. | ............ 257/718 |
| 5,852,871 | A | * | 12/1998 | Khandros | ............ 324/754 |
| 5,864,946 | A | * | 2/1999 | Eldridge et al. | ............ 324/754 |
| 5,900,738 | A | * | 5/1999 | Khandros et al. | ............ 324/761 |
| 5,983,493 | A | * | 11/1999 | Eldridge et al. | ............ 29/843 |
| 6,023,103 | A | * | 2/2000 | Chang et al. | ............ 257/781 |
| 6,031,282 | A | * | 2/2000 | Jones et al. | ............ 257/692 |
| 6,043,563 | A | * | 3/2000 | Eldridge et al. | ............ 257/784 |
| 6,184,576 | B1 | * | 2/2001 | Jones et al. | ............ 257/696 |
| 6,351,133 | B1 | * | 2/2002 | Jones et al. | ............ 324/754 |

* cited by examiner

Primary Examiner—Michael J. Sherry
Assistant Examiner—Jermele Hollington
(74) Attorney, Agent, or Firm—Muramatsu & Associates (57) ABSTRACT

A probe contactor is formed on a planar surface of a substrate by a photolithography technology. The probe contactor is configured by a substrate having an interconnect trace thereon which is an electric conductive path, and a contactor formed on the substrate through a photolithography process. The contactor has a base portion vertically formed on the substrate, a horizontal portion, one end of which is formed on the base portion, and a contact portion formed on another end of the horizontal portion. A spring force of the horizontal portion of the contactor provides a contact force when the probe contactor is pressed against a contact target. The contact portion of the contactor is sharpened so that when the contactor is pressed against the contact target, it scrubs a surface of the contact target.

13 Claims, 13 Drawing Sheets

PROBE CONTACTOR AND PRODUCTION METHOD THEREOF

This is a continuation-in-part of application Ser. No. 09/099,614, filed Jun. 19, 1998, entitled "PROBE CONTACT FORMED OF PHOTOLITHOGRAPHY PROCESS", now abandoned.

FIELD OF THE INVENTION

This invention relates to probe contactors and production method thereof to establish electrical contact with contact targets such as contact pads or leads of electronic circuits or devices, and more particularly, to probe contactors and production method thereof to be used in a probe card to test semiconductor wafers, semiconductor chips, packaged semiconductor devices or printed circuit boards and the like with an improved frequency bandwidth, density and quality.

BACKGROUND OF THE INVENTION

In testing high density and high speed electrical devices such as LSI and VLSI circuits, high performance probe contactors or test contactors must be used. The probe contactors of the present invention is not limited to the application of testing and burn-in of semiconductor wafers and die, but is inclusive of testing and burn-in of packaged semiconductor devices, printed circuit boards and the like. The probe contactors of the present invention can also be used in more general applications including an IC lead, IC packaging, and other electrical connections. However, for the convenience of explanation, the present invention is described mainly with reference to the semiconductor wafer testing.

Figure 1:
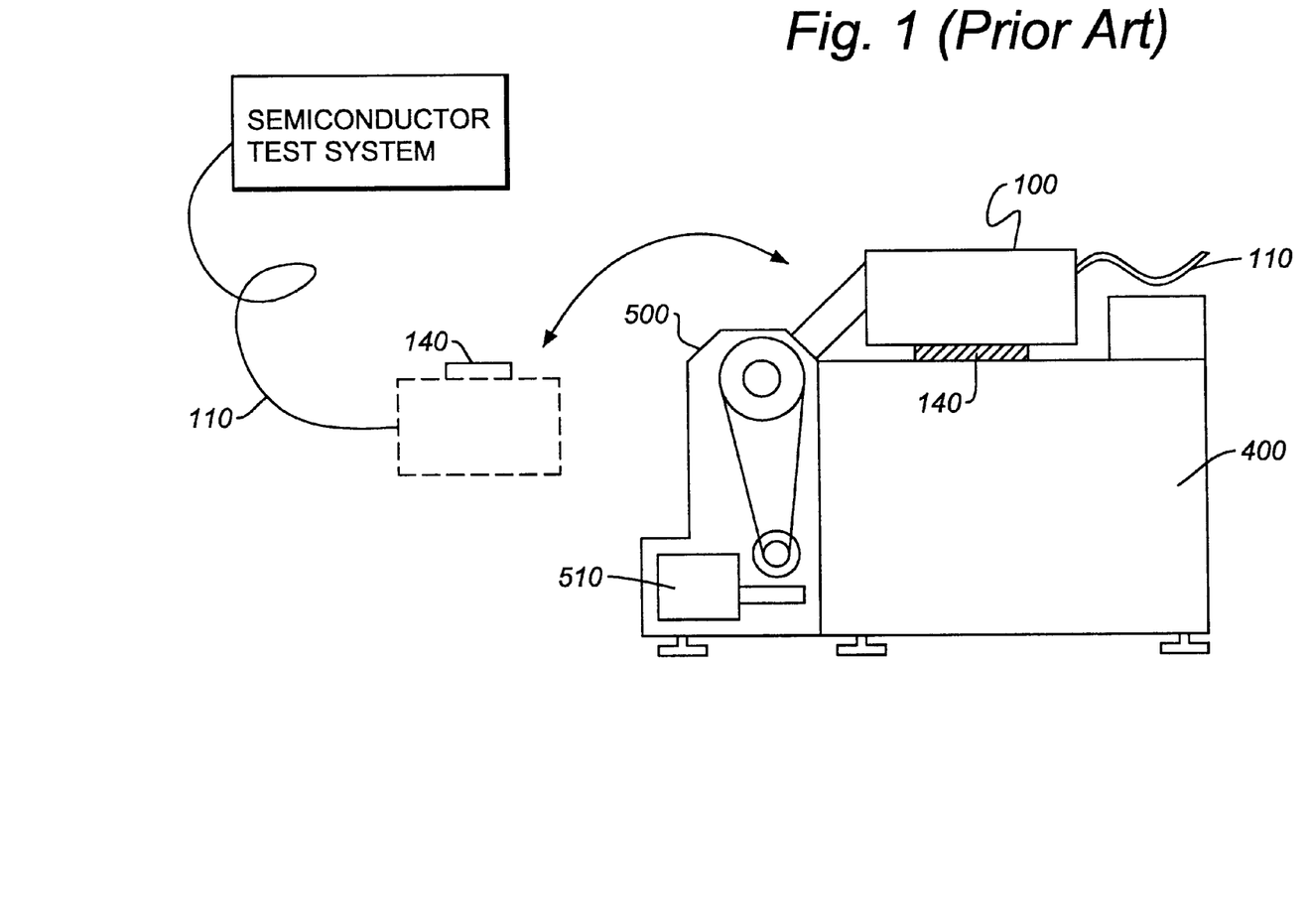
FIG. 1 is a schematic diagram showing a structural relationship between a substrate handler and a semiconductor test system having a test head.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and the substrate handler 400 are mechanically connected with one another by means of a manipulator 500 driven by a motor 500 and the semiconductor wafers to be tested are automatically provided to a test position of the test head by the substrate handler.

On the test head, the semiconductor wafer to be tested is provided with test signals generated by the semiconductor test system. The resultant output signals from the semiconductor wafer under test are transmitted to the semiconductor test system wherein they are compared with expected data to determine whether IC circuits on the semiconductor wafer function correctly.

Figure 2:
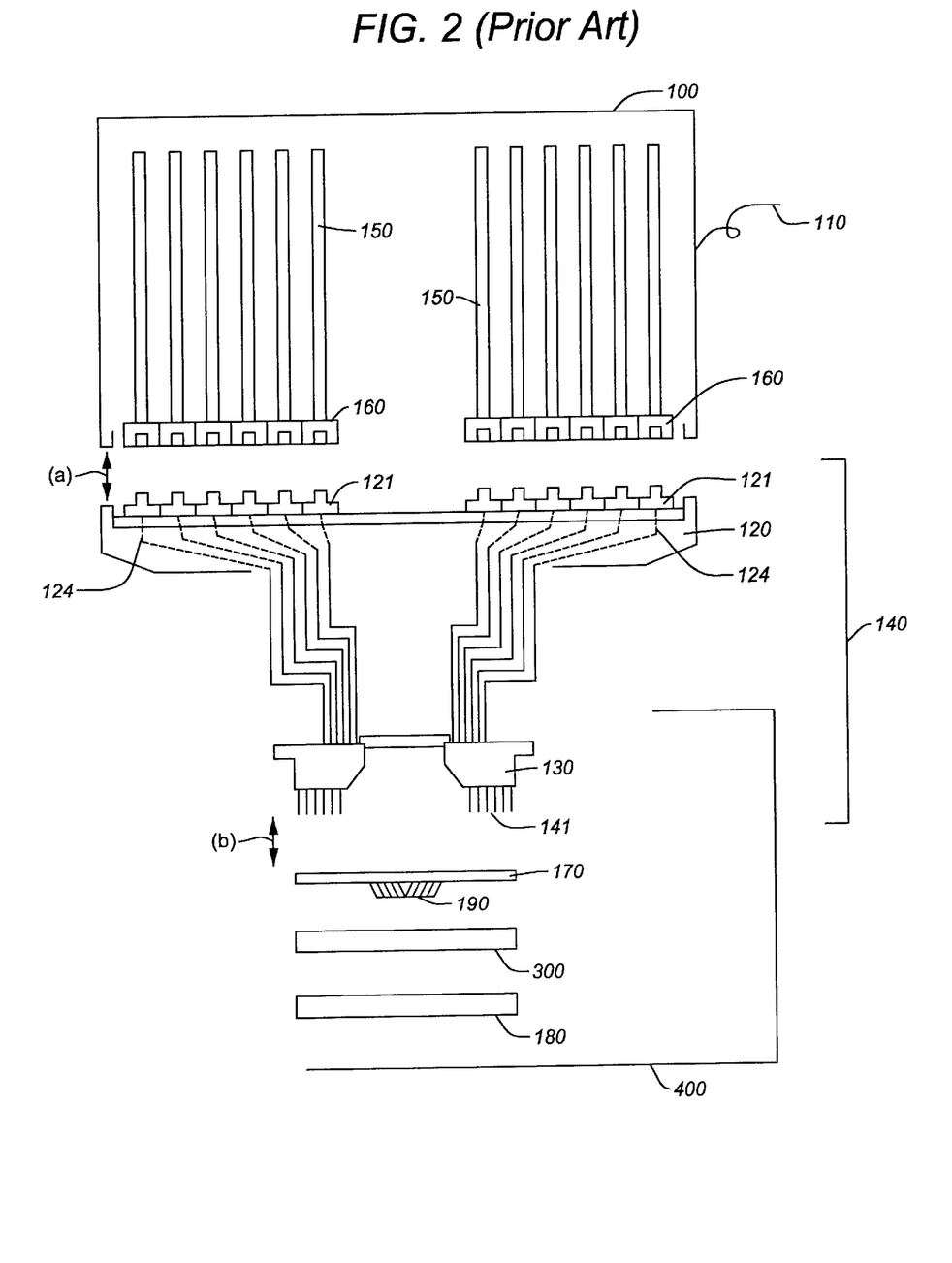
FIG. 2 is a schematic diagram showing an example of detailed structure for connecting the test head of the semiconductor test system to the substrate handler.

The test head and the substrate handler are connected with an interface component 140 consisting of a performance board 120 which is a printed circuit board having electric circuit connections unique to a test head's electrical footprint, coaxial cables, pogo-pins and connectors. In FIG. 2, the test head 100 includes a large number of printed circuit boards 150 which correspond to the number of test channels. Each of the printed circuit boards has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

FIG. 2 further shows, in more detail, a structure of the substrate handler 400, the test head 100 and the interface component 140 when testing a semiconductor wafer. As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. A probe card 170 is provided above the semiconductor wafer 300 to be tested. The probe card 170 has a large number of probe contactors (such as cantilevers or needles) 190 to contact with circuit terminals or contact targets in the IC circuit of the wafer 300 under test.

Electrical terminals or contact receptacles of the probe card 170 are electrically connected to the contact pins 141 provided on the frog ring 130. The contact pins 141 are also connected to the contact terminals 121 of the performance board 120 with coaxial cables 124 where each contact terminal 121 is connected to the printed circuit board 150 of the test head 100. Further, the printed circuit boards 150 are connected to the semiconductor test system through the cable 110 having several hundreds of inner cables.

Under this arrangement, the probe contactors 190 contact the surface of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the semiconductor wafer 300 performs properly.

Figure 3:
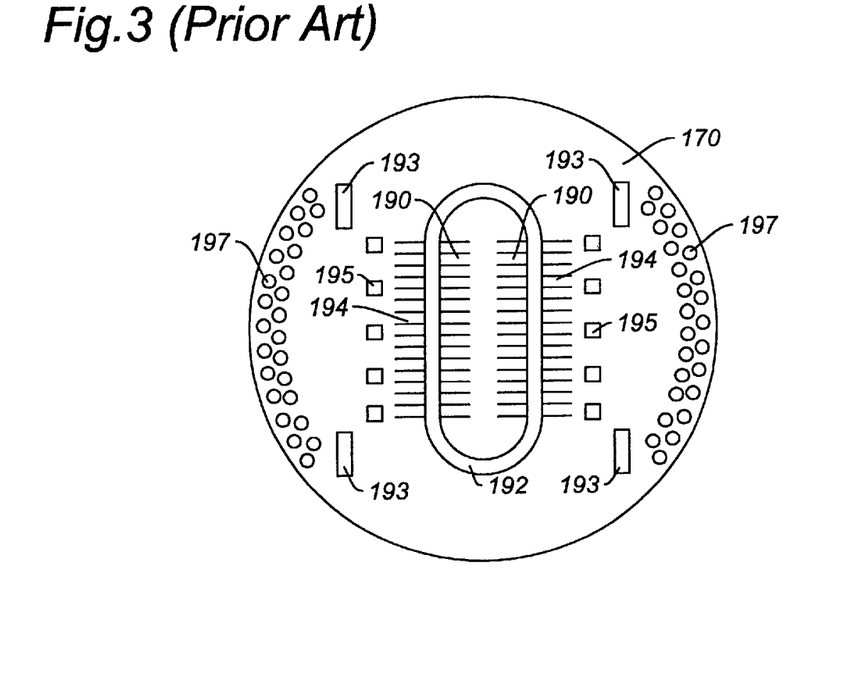
FIG. 3 is a bottom view showing an example of the probe card having an epoxy ring for mounting a plurality of cantilevers as probe contactors.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the cantilevers 190 contact the pads or bumps on the wafer 300. The ends of the cantilevers 190 are connected to wires 194 which are further connected to transmission lines (not shown) formed in the probe card 170. The transmission lines are connected to a plurality of electrodes 197 which contact the pogo pins 141 of FIG. 2.

Typically, the probe card 170 is structured by a multilayer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant and magnetic permeability of the polyimide, inductances, and capacitances of the signal within the probe card 170. Thus, the signal lines are impedance matched lines to achieve a high frequency transmission bandwidth to the wafer 300 providing current during steady state and high current peaks generated by the device's outputs switching. For removing noise, capacitors 193 and 195 are provided on the probe card between the power and ground planes.

An equivalent circuit of the probe card 170 is shown in FIG. 4 to explain the limitation of bandwidth in the conventional probe card technology. As shown in FIGS. 4A and 4B, the signal transmission line on the probe card 170 extends from the electrode 197, the strip line (impedance matched line) 196, the wire 194 and the needle (cantilever) 190. Since the wire 194 and needle 190 are not impedance matched, these portions function as an inductor L in the high frequency band as shown in FIG. 4C. Because of the overall length of the wire 194 and needle 190 is around 20–30 mm, the significant frequency limitation is resulted in testing a high frequency performance of a device under test.

Figure 4A:
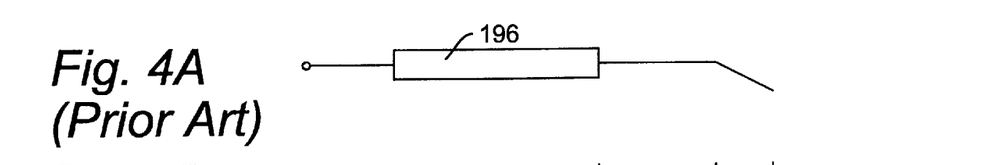
FIGS. 4A–4E are circuit diagrams showing equivalent circuits of the probe card of FIG. 3.
Figure 4B:
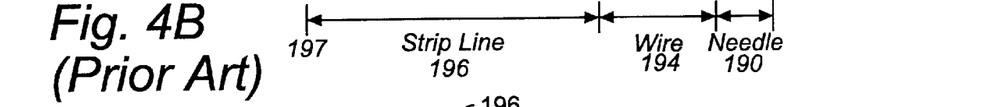
Figure 4C:
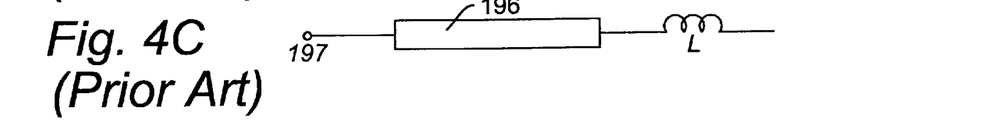
Figures 4D, 4E:
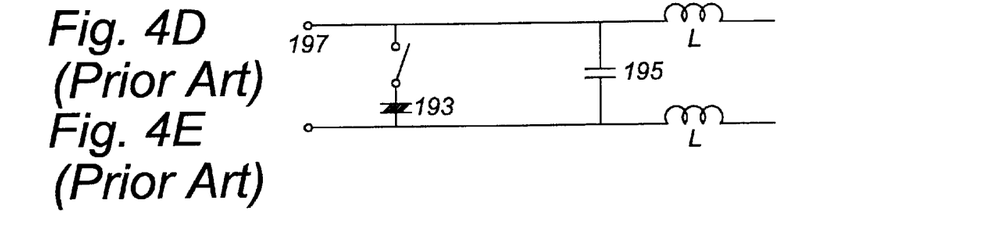

Other factors which limit the frequency bandwidth in the probe card 170 reside in the power and ground needles shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines. Thus, the capacitors also limit the high frequency operation of the probe card 170.

Accordingly, the most widely used probe contactors as noted above are limited to the frequency bandwidth of approximately 200 MHz, which is insufficient to test recent semiconductor devices. It is considered, in the industry, that the frequency bandwidth be of at least that equal to the IC tester's capability which is currently on the order of 1 GHz or higher, will be necessary in the near future. Further, it is desired in the industry that a probe card is capable of handling a large number of semiconductor devices, especially memories, such as 32 or more, in parallel (parallel test) to increase test throughput.

One of new types of probe card having membrane contactors is expected to have a sufficiently high bandwidth because it can incorporate impedance matched transmission lines to the tips of the contactors. However, membrane contactors have a disadvantage in that they are deformed by the temperature change to a degree that the contact performance is no longer available. Another disadvantage of the membrane contactors resides in that only limited number of contactors can be fabricated on the membrane because of the difficulty of providing spring forces to the contactors. One last disadvantage inherent in the technology is the lack of individual compliance in the contactors relative to one another. This is because the contactors are mounted on the common membrane thereby limiting the independent movement of a contactor from the movement of the other. Therefore, the membrane contactors are not suitable for testing a large number of devices in parallel.

In the conventional technology, the probe card and probe contactors such as shown in FIG. 3 are manually made, resulting in inconsistent quality. Such inconsistent quality includes fluctuations of size, frequency bandwidth, contact force and resistance, etc. In the conventional probe contactors, another factor making the contact performance unreliable is that the probe contactors and the semiconductor wafer under test have different temperature expansion ratios. Thus, under the varying temperature, the contact positions therebetween may vary which adversely affects the contact force, contact resistance and bandwidth.

SUMMARY OF THE INVENTION

Therefore, it is an object of the present invention to provide a contactor for electrically contacting with a contact target which is capable of achieving a high frequency bandwidth, high pin counts and high contact performance as well as high reliability.

It is another object of the present invention to provide a contact structure such as a probe contactor to establish electrical connection in applications such as testing semiconductor devices and the like, having a very high frequency bandwidth to meet the test requirements in the next generation semiconductor technology.

It is a further object of the present invention to provide probe contactors to be used in testing a semiconductor wafer, packaged LSI and the like which are suitable for testing a large number of semiconductor devices in parallel at the same time.

It is a further object of the present invention to provide probe contactors to be used in testing a semiconductor wafer, packaged LSI and the like which are produced through standard semiconductor production process without involving manual assembly or handling, thereby achieving consistent quality.

It is a further object of the present invention to provide probe contactor to be mounted on a probe card for testing a semiconductor wafer, packaged LSI and the like which are capable of compensating temperature expansion coefficient of a semiconductor wafer under test.

In the present invention, a probe contactor for establishing an electrical connection with a contact target is formed by a substrate of a planar surface on which a contactor is created by a photolithography process established in the semiconductor technology.

The probe contactor of the present invention is comprised of a substrate having an interconnect trace thereon which is an electrically conductive path, and a contactor formed on the substrate through a photolithography process wherein the contactor has a base portion vertically formed on the substrate, a horizontal portion, one end of which is formed on the base portion, and a contact portion formed on another end of the horizontal portion, and wherein the horizontal portion of the contactor produces a contact force when the probe contactor is pressed against the device under test.

Another aspect of the present invention is a process for producing the probe contactor. The method of producing the probe contactor is comprised of the steps of forming an interconnect trace on a silicon substrate either by deposition or plating, and applying photolithography processes for forming a contactor having a base portion vertically formed on the interconnect trace, a horizontal portion one end of which is formed on the base portion and a contact portion formed on another end of the horizontal portion wherein each of the photolithography processes includes steps of photoresist coating, masking, exposure, developing, photoresist stripping and conductive material deposition.

According to the present invention, the contactor has a very high frequency bandwidth to meet the test requirements in the next generation semiconductor technology. Since the probe contactor is formed through a modern miniaturization technology used in the semiconductor production process, a large number of contactors can be aligned in a small space which is suitable for testing a large number of semiconductor devices at the same time.

Since the large number of probe contactors are produced at the same time on the substrate with the use of the microfabrication technology without involving manual handling, it is possible to achieve consistent quality, high reliability and long life in the contact performance. Further, because the probe contactors can be fabricated on the same substrate material as that of the device under test, it is possible to compensate the temperature expansion coefficient of the device under test, which is able to avoid positional errors.

DETAILED DESCRIPTION OF THE PREFERRED EMBODIMENT

Figure 5A:
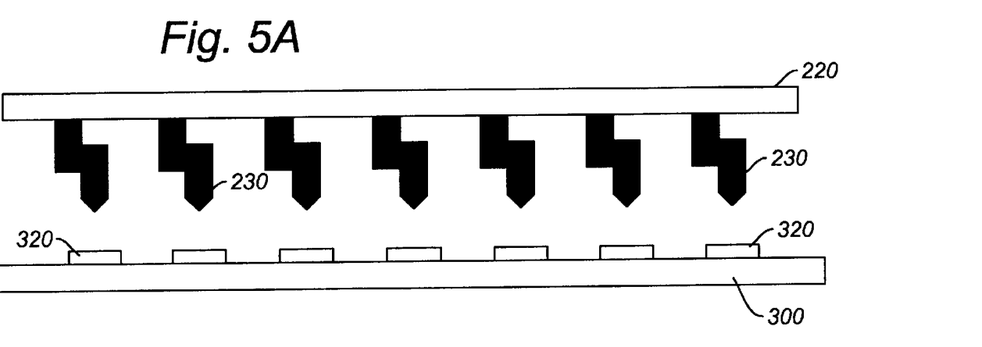
FIG. 5A is a schematic cross sectional diagram showing probe contactors of the present invention produced through a photolithography process.
Figure 5B:
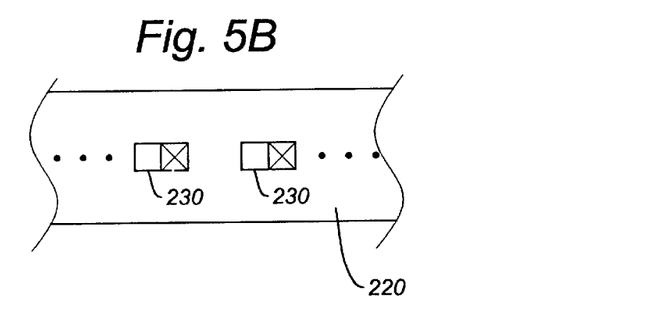
FIG. 5B is a bottom view of the probe contactors of FIG. 5A.

The contactors of the present invention will be described with reference to FIGS. 5–14. FIGS. 5A and 5B show an example of contactors 230 of the present invention formed on a substrate 220. FIGS. 8–13 show various other shapes of the probe contactors of the present invention. The substrate 220 is typically a silicon substrate although other materials such as glass fiber, ceramic, alumina or other dielectric materials are also feasible. All of the contactors 230 are produced through the same production process such as a photolithography process on the silicon or dielectric substrate 220.

When the semiconductor wafer 300 under test moves upward, the contactors 230 contact corresponding contact targets (electrodes) 320 on the wafer 300. The pitch between the pads 320 may be as small as 50 $\mu$m or less, the contactors 230 can easily be aligned in the same pitch since they are made through the same semiconductor production process as the wafer 300 are made. As shown in the bottom view of FIG. 5B, the probe contactor 230 is rectangular or square shaped in cross section.

The contactors 230 on the silicon substrate 220 can be directly mounted on a probe card such as shown in FIG. 3, or molded in a package, such as a traditional IC package having leads, so that the package is mounted on a probe card. Since the contactors 230 can be fabricated in a very small size, a frequency bandwidth of a probe card mounting the contactors of the present invention can be easily increased to 2 GHz or higher. Because of the small size, the number of contactors on a probe card can be increased to, for example 2,000, which is able to test as many as 32 or more memory devices in parallel at the same time.

Furthermore, because the contactors 230 of the present invention are formed on the silicon substrate 220, environmental changes such as a temperature expansion ratio of the silicon substrate are the same as those of the semiconductor wafer 300 under test. Therefore, the accurate positioning between the contactors 230 and the pads 320 can be maintained throughout the test.

Figure 6A:
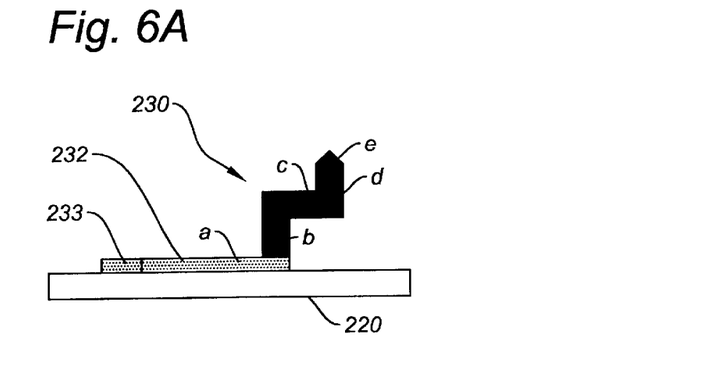
FIGS. 6A–6C are schematic diagrams showing examples of structure of the probe contactor of the present invention formed on a silicon substrate.
Figure 6B:
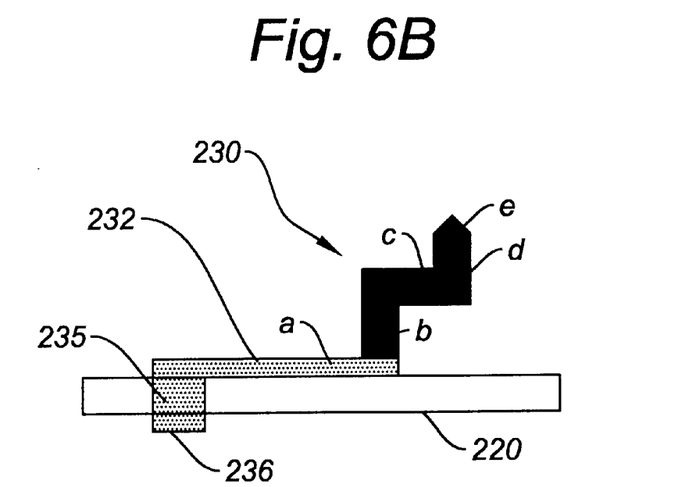
Figure 6C:
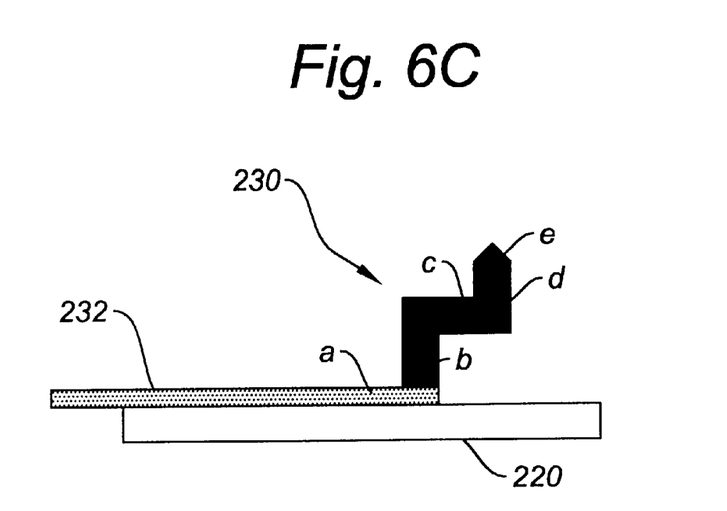

FIGS. 6A–6C provide more detailed views of the contactor 230 on the silicon substrate 220. To establish an interconnection with the probe card or the IC package as noted above, the examples of FIGS. 6A–6C show basic three types of electrical path to form such interconnections. FIG. 6A shows an example in which such an electrical connection is established at the top of the substrate. FIG. 6B shows an example in which an electrical connection is established at the bottom of the substrate while FIG. 6c shows an example in which an electrical connection is formed at the edge of the substrate. Almost any types of existing IC package design or probe card design can accommodate at least one of the interconnect types of FIGS. 6A–6C.

The example of FIG. 6A includes an interconnect trace 232 also designated by a and an interconnect pad 233 on the substrate 220. The interconnect trace 232 establishes an electric path from the contactor 230 to the interconnect pad 233. The example of FIG. 6B includes an interconnect trace 232, an interconnect pad 235 via the substrate 220 and an interconnect pad 236 at the bottom of the substrate 220. In the example of FIG. 6C, the interconnect trace 232 extends to the edge of the substrate 220. In each of the examples, the interconnect trace 232 also functions to fan-out the small pitch of the contactors 230 to a larger pitch to fit to the probe card or IC package.

As shown in each of FIGS. 6A–6C, the contactor 230 has vertical portions b and d and a horizontal beam c and a tip portion e. The tip portion e of the contactor 230 is preferably sharpened to achieve a scrubbing effect when pressed against the contact target 320 requiring penetration through a metal-oxide layer. For example, if the target 320 on the wafer 300 has aluminum oxide on its surface, the scrubbing effect is necessary to establish the electric contact with low contact resistance. The spring force of the horizontal beam c provides an appropriate contact force against the contact pad 320. The elasticity produced by the spring force of the horizontal beam c also functions to compensate the differences in size or the fluctuation of flatness involved in the contactors 230, the silicon substrate 22, the contact pad 320 and the wafer 300.

An example of material of the contactor 230 includes nickel, aluminum and copper. The tip portion e may be plated by nickel palladium, rhodium, nickel gold, iridium or several other depositable materials. An example of size of the contactor intended for a probe-test application may be 100–400 microns (about 200 $\mu$m optimum) in overall height, 50–400 microns (150–200 $\mu$m optimum) in horizontal length, and about 30–60 microns in thickness for the pitch of 50 $\mu$m between contact targets 320.

Figure 7A:
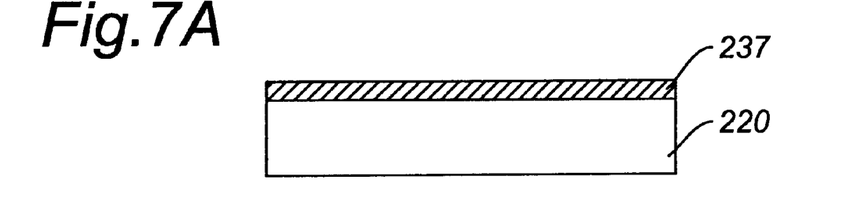
FIGS. 7A–7R are schematic diagrams showing an example of production process for producing the probe contactor of the present invention.
Figure 7B:
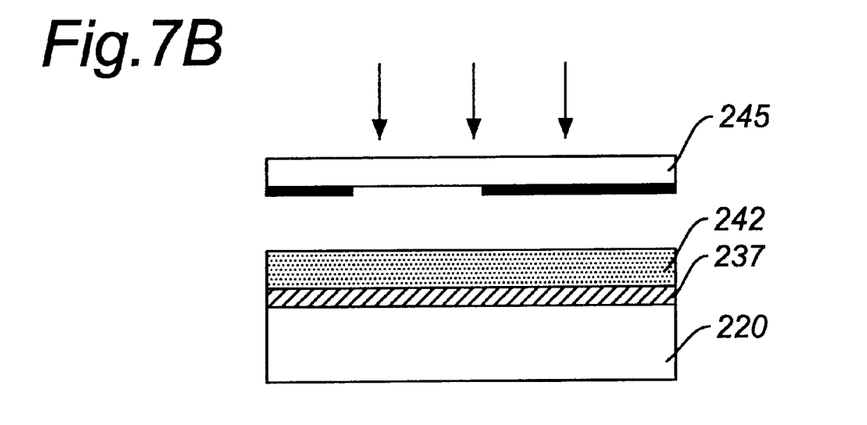
Figure 7C:
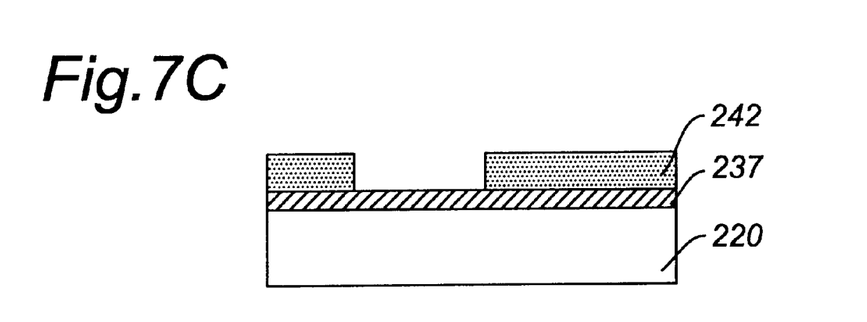
Figure 7D:
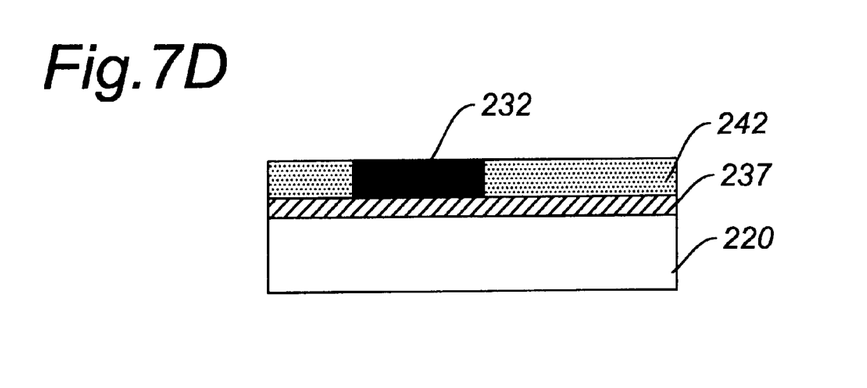
Figure 7E:
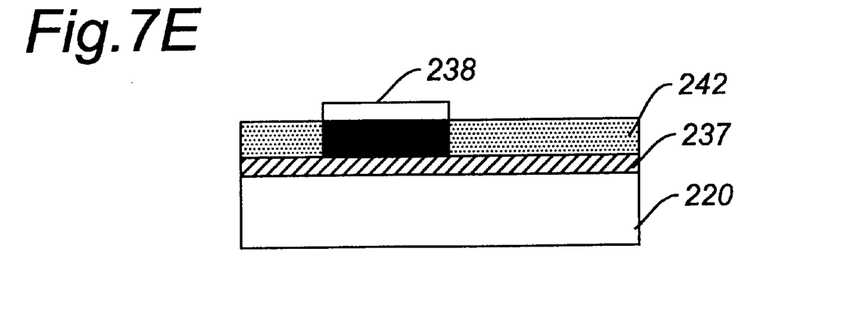
Figure 7F:
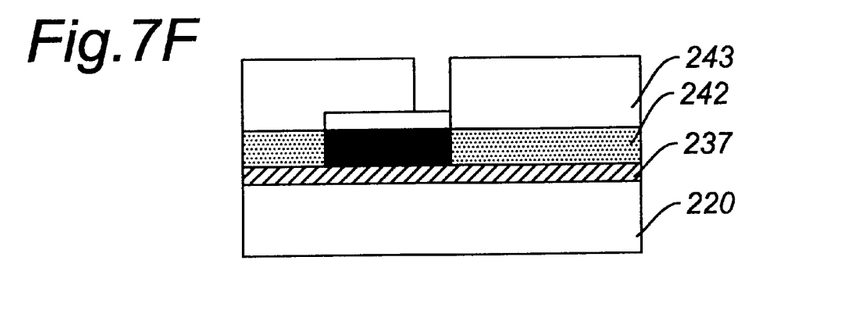
Figure 7G:
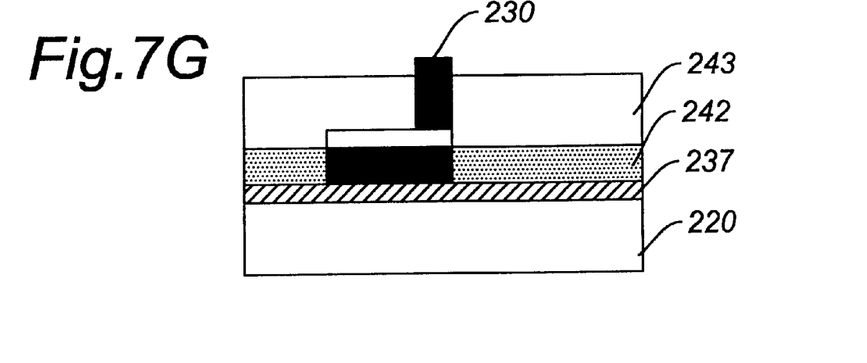
Figure 7H:
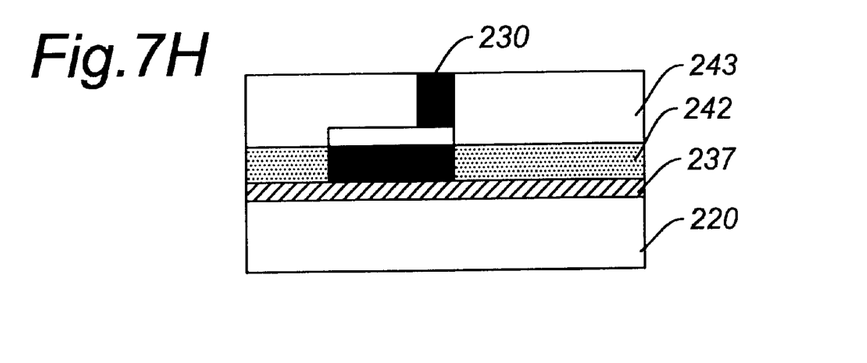
Figure 7I:
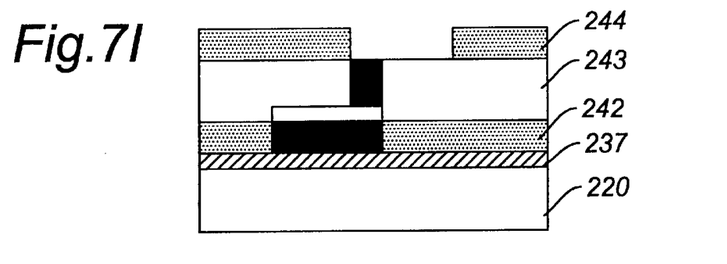
Figure 7J:
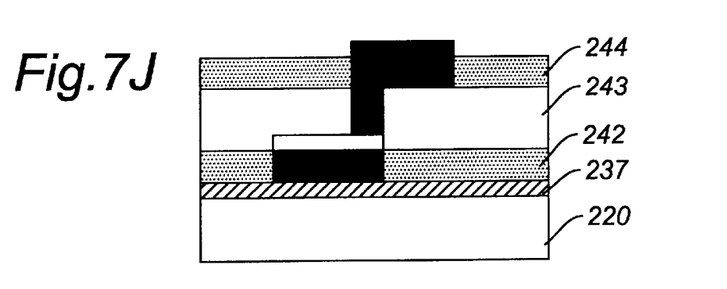
Figure 7K:
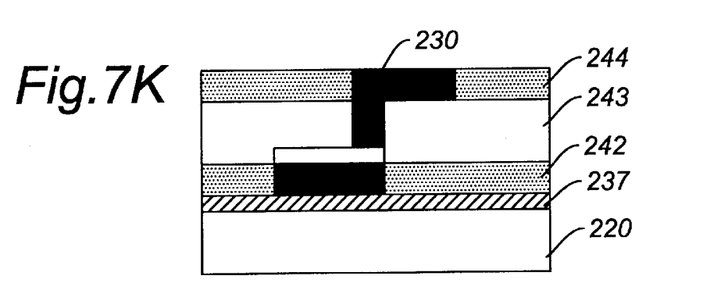
Figure 7L:
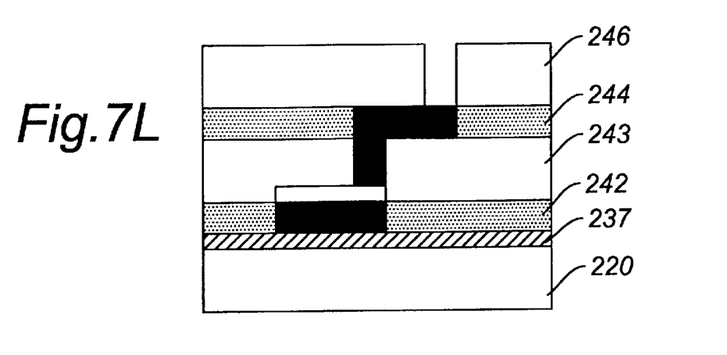
Figure 7M:
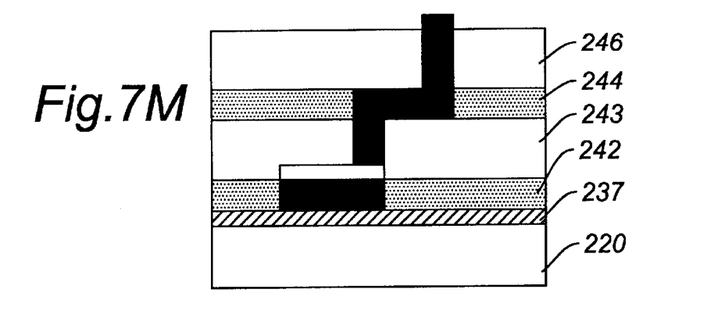
Figure 7N:
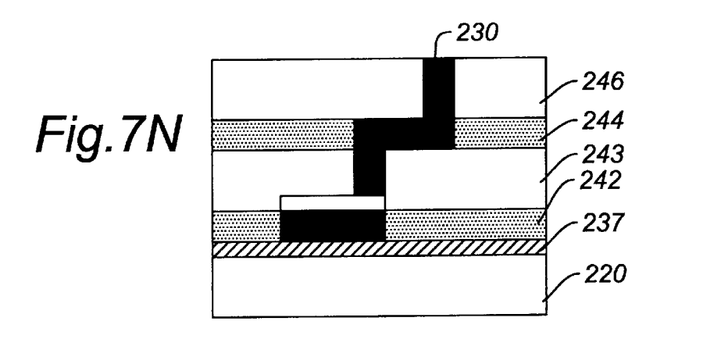
Figure 7O:
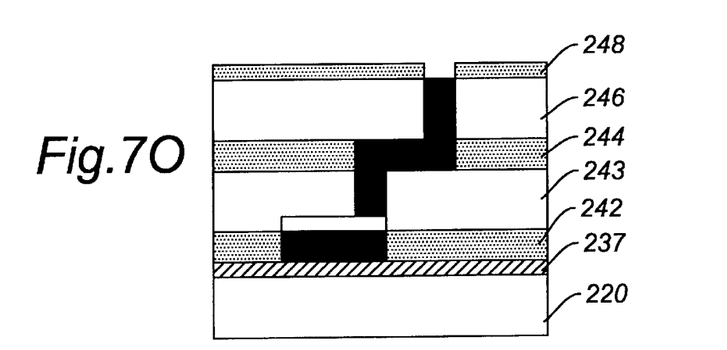
Figure 7P:
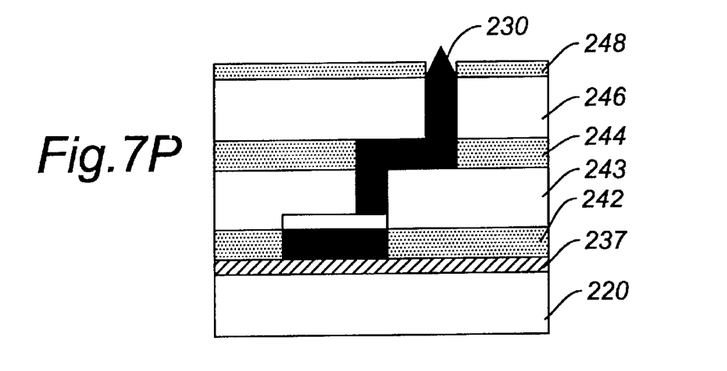
Figure 7Q:
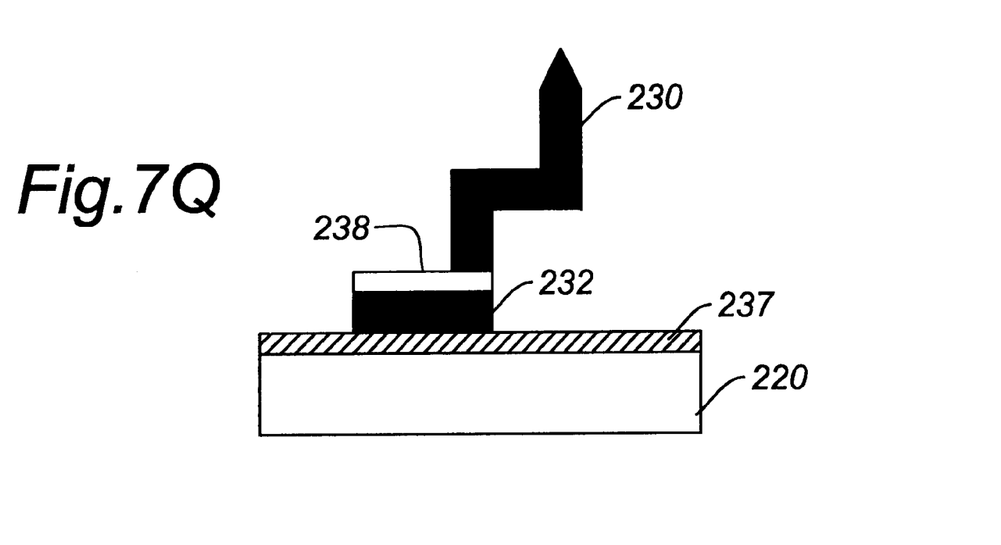
Figure 7R:
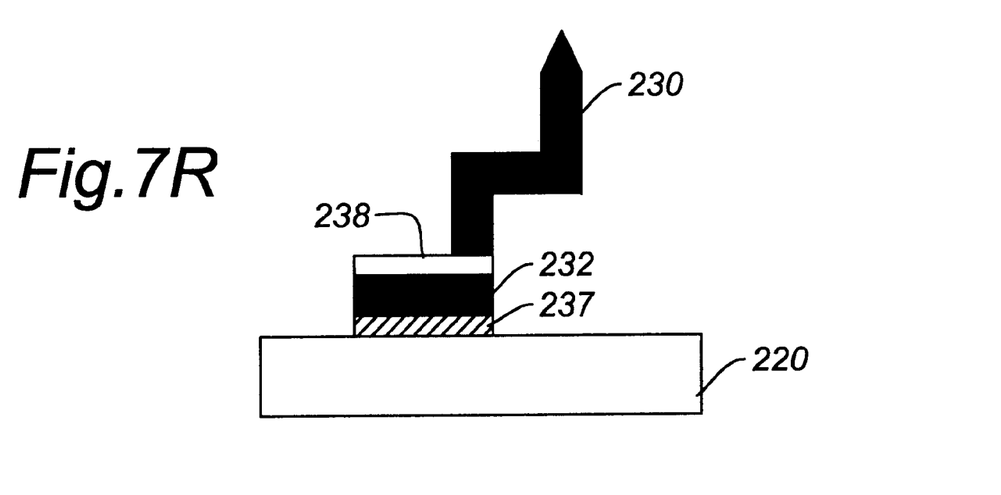

FIGS. 7A–7R show an example of process for producing the contactors of the present invention through the photolithography technology. In FIG. 7A, a thin metal layer 237 made, for example of copper, is provided on the silicon substrate 220. The metal layer 237 is to achieve electrical conductivity for forming the interconnect trace 232 and contactor 230 of FIG. 6 through a electroplating process. If the interconnect trace 232 and contactor 230 are formed through other deposition process such as sputtering, the thin metal layer 237 may not be necessary.

A photoresist layer 242 is formed on the trace layer 232 over which a mask 245 is aligned to be exposed with ultraviolet light as shown in FIG. 7B. If a positive acting resist is used, the photoresist covered by the opaque portions of the mask 245 harden (cure) after exposure. The exposed part of the resist can be dissolved and washed away, leaving a photo mask layer 242 of FIG. 7C. The contactor material such as copper, nickel, aluminum or other metal is deposited in the window of the photo mask 242 to form the interconnect trace 232 as shown in FIG. 7D. The interconnect trace 232 of FIG. 7D corresponds to the portion a shown in FIGS. 6A–6C.

In the process of FIG. 7E, a thin metal layer 238 is formed by, for example plating, on the interconnect trace 232. One of the purposes of the metal layer 238 is to protect the interconnect trace 232 from etching. Materials of the metal layer 238 should be different from that of the interconnect trace 232 or thin metal layer 237. In FIG. 7F, a photo mask layer 243 is formed on the photo mask 242 through the same photolithography process of FIGS. 7B and 7C. In FIG. 7G, the contactor material such as nickel, aluminum and copper is deposited in the window of the photo mask 243 to form the vertical portion b of the contactor 230 shown in FIG. 6. A variety of deposition techniques can be used in this process including vacuum evaporation, cathode sputtering, vapor-phase deposition as well as plating techniques. The overlapped portion of FIG. 7G is removed in the grinding (planarizing) process of FIG. 7H.

The foregoing process will be repeated for forming the other portions of the contactor. In FIG. 7I, using the process of FIG. 72 and 7C, a photo mask layer 244 is created over the photo mask layer 243 to form the horizontal beam c of the contactor 230. Through the deposition process, the horizontal beam c is formed as shown in FIG. 7J for which a planarizing process is performed to remove the overlapped portion as shown in FIG. 7K. On the photo mask 244 and the horizontal beam c, a photo mask layer 246 is provided as shown in FIG. 7L to form the vertical portion d of the contactor 230. The photo mask 246 is created by the same photolithography process of FIG. 7B and 7C. Thus, after the deposition, the vertical portion d of FIG. 6 is formed in the photo mask layers as shown in FIG. 7M for which a planarizing process is performed to remove the overlapped portion as shown in FIG. 7N. FIG. 7O also shows a photo mask 248 to form a tip e of the contactor 230 which is shown in FIG. 7P.

In FIG. 7Q, the photo masks 242, 243, 244, 246 and 248 are stripped off in a special solvent. An etching process is conducted so that most of the metal layer 237 is removed as shown in FIG. 7R. As in the foregoing, the contactor 230 and the interconnect trace 232 are formed on the silicon substrate 220 by the photolithography technology.

Figure 8A:
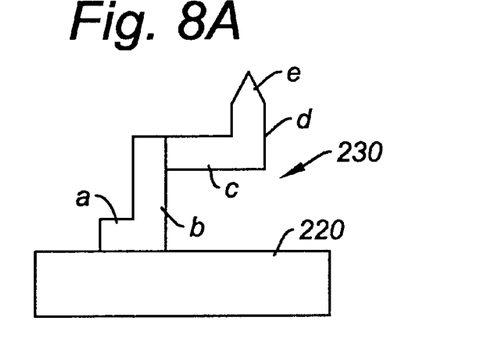
FIG. 8A is a cross sectional front view of another example of probe contactor and FIG. 8B is a top view of the probe contactor of FIG. 8A.
Figure 8B:
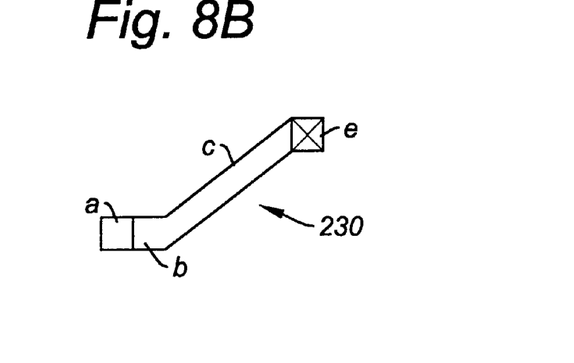
Figure 14A:
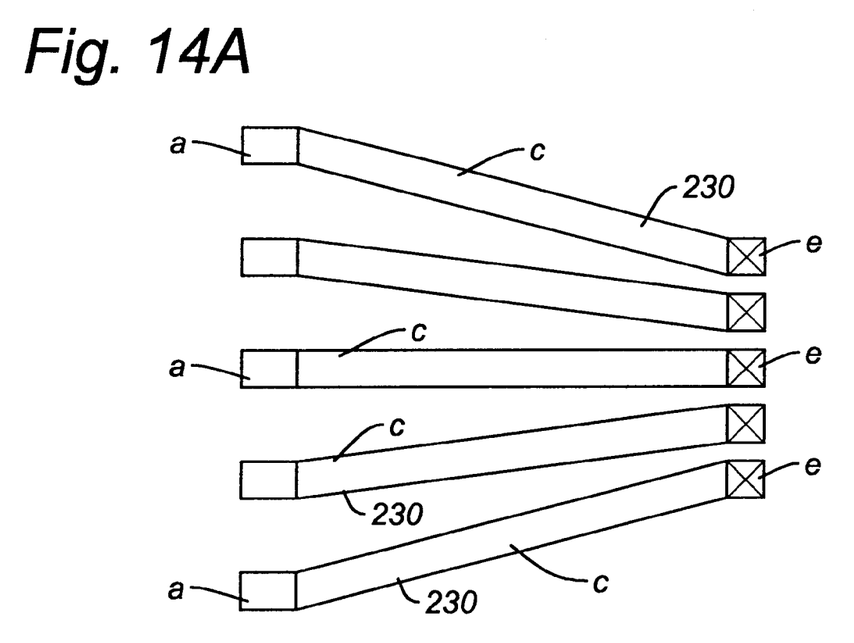
FIGS. 14A and 14B are schematic bottom views showing examples of alignment in the probe contactors of the present invention in a manner to change pitches between contact points of the probe contactors to pitches between base ends of the probe contactors.

FIG. 8A is a cross sectional front view of another example of probe contactor. In this example, the horizonal beam c of the probe contactor 230 is in a diagonal direction as shown in the top view of FIG. 8B. Namely, the horizontal beam c is inclined relative to the direction of the base end a (contract trace 232 of FIG. 6). With use of different angles of diagonal direction, the probe contactors of the present invention can easily change the small pitch between the contact points thereof to a larger pitch between the based ends a thereof which is connected to the contact traces 232 (FIGS. 6A–6C) as shown in FIG. 14A. Other portions of the probe contactor 230 are basically the same as those of the example of FIGS. 5A and 5B. Because the horizonal beam is in the diagonal direction, the contact point scrubs the surface of the contact target in the diagonal direction, resulting in the excellent contact performance.

Figure 9A:
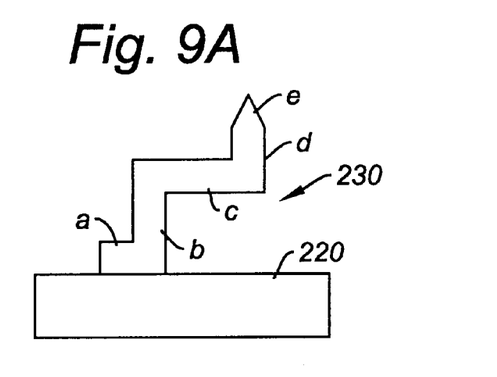
FIG. 9A is a cross sectional front view of a further example of probe contactor and FIG. 9B is a top view of the probe contactor of FIG. 9A.
Figure 9B:
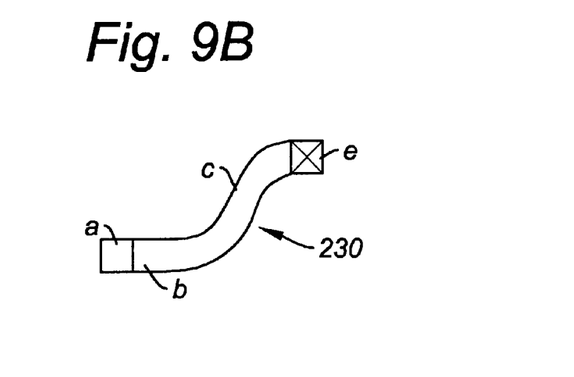
Figure 14B:
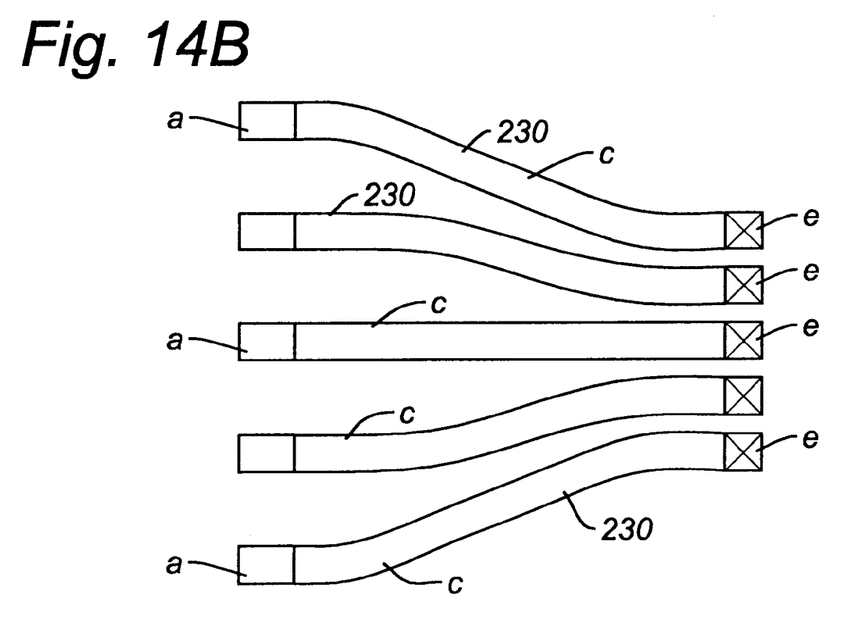

FIG. 9A is a cross sectional front view of a further example of probe contactor. In this example, the horizonal beam c of the probe contactor 230 is curved in a diagonal direction as shown in the top view of FIG. 9B relative to the direction of the base end a. With use of different angles of diagonal direction, the probe contactors of the present invention can easily change the small pitch between the contact points e thereof to a larger pitch between the based ends a thereof which is connected to the contact traces 232 (FIGS. 6A–6C) as shown in FIG. 14B. Other portions of the probe contactor 230 are basically the same as those of the example of FIGS. 5A and 5B. Because the horizonal beam is in the diagonal direction, the contact point scrubs the surface of the contact target in the diagonal direction, resulting in the excellent contact performance.

Figure 10A:
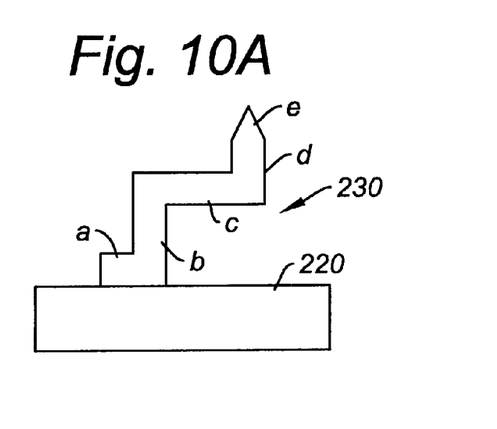
FIG. 10A is a cross sectional front view of a further example of probe contactor and FIG. 10B is a top view of the probe contactor of FIG. 10A.
Figure 10B:
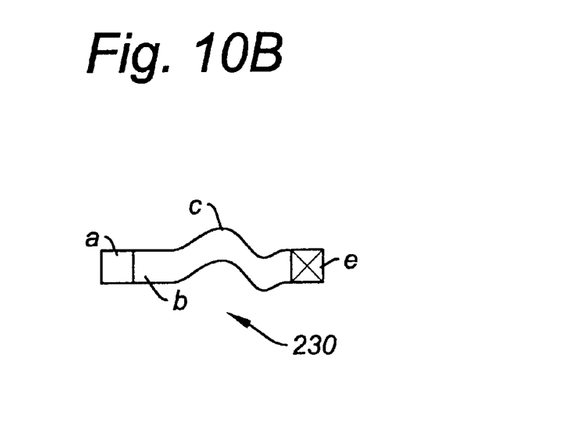
Figure 11A:
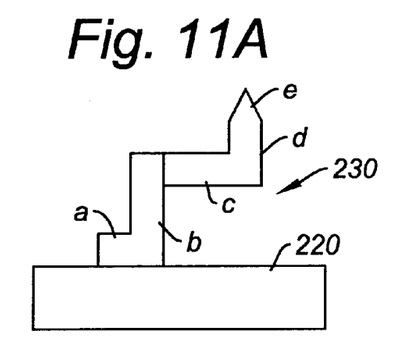
FIG. 11A is a cross sectional front view of a further example of probe contactor and FIG. 11B is a top view of the probe contactor of FIG. 11A.
Figure 11B:
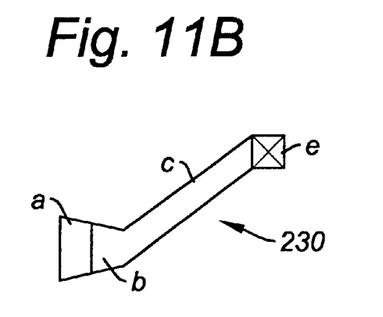

FIG. 10A is a cross sectional front view of a further example of probe contactor. In this example, the horizonal beam c of the probe contactor 230 is curved in a manner shown in the top view of FIG. 10B. FIG. 11A is a cross sectional front view of a further example of probe contactor. In this example, the base end a and vertical beam b have a larger width than that of the horizontal beam c and top beam d, and horizontal beam is extended in the diagonal direction as shown in the top view of FIG. 11B. is a top view of the probe contactor of FIG. 11A.

Figure 12A:
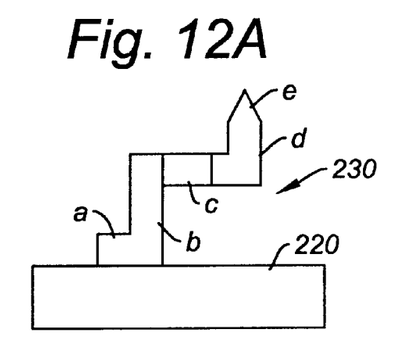
FIG. 12A is a cross sectional front view of a further example of probe contactor and FIG. 12B is a top view of the probe contactor of FIG. 12A.
Figure 12B:
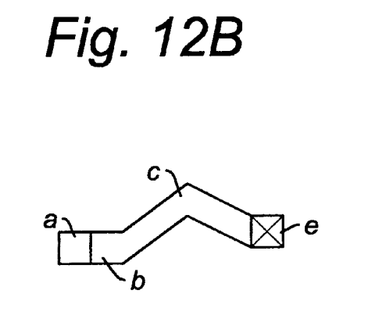
Figure 13A:
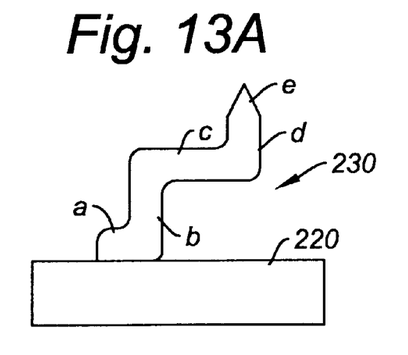
FIG. 13A is a cross sectional front view of a further example of probe contactor and FIG. 13B is a top view of the probe contactor of FIG. 13A.
Figure 13B:
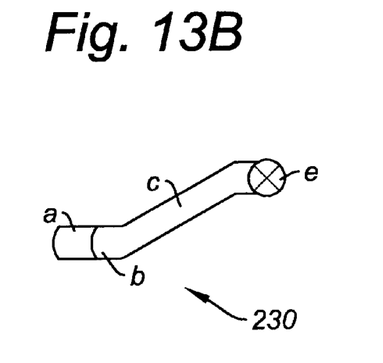

FIG. 12A is a cross sectional front view of a further example of probe contactor. In this example, the horizontal beam c is bent in the manner shown in the top view of FIG. 12B. FIG. 13A is a cross sectional front view of a further example of probe contactor. In this example, the vertical and horizontal are circular in cross section, and the horizontal beam c is extended in the diagonal direction as shown the top view of FIG. 13B.

FIG. 14A is a schematic bottom view showing an example of alignment in the probe contactors of the present invention in a manner to change pitches between contact points of the probe contactors to pitches between base ends of the probe contactors. This example involves different angles of diagonal direction using the probe contactors of FIGS. 8A and 8B to change the small pitch between the contact points e thereof to a larger pitch between the based ends a thereof.

FIG. 14B is a schematic bottom view showing another example of alignment in the probe contactors of the present invention in a manner to change pitches between contact points of the probe contactors to pitches between base ends of the probe contactors. This example involves different angles of diagonal direction using the probe contactors of FIGS. 9A and 9B to change the small pitch between the contact points e thereof to a larger pitch between the based ends a thereof.

According to the present invention, the probe contactor has a very high frequency bandwidth to meet the test requirements of next generation semiconductor technology. Since the probe contactor is formed through a modern miniaturization technology used in the semiconductor production process, a large number of contactors can be aligned in a small space which is suitable for testing a large number of semiconductor devices at the same time. The contact structure of the present invention can also be used in more general applications including an IC lead, IC packaging, and other electrical connections.

Since the large number of probe contactors are produced at the same time on the substrate with the use of the microfabrication technology without involving manual handling, it is possible to achieve consistent quality, high reliability and long life in the contact performance. Further, because the probe contactors can be fabricated on the same substrate material as that of the device under test, it is possible to compensate the temperature expansion coefficient of the device under test, which is able to avoid positional errors.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A probe contactor for electrical connection with a contact target, comprising:
   a dielectric substrate;
   an interconnect trace provided on a surface of the dielectric substrate for establishing an electric conductive path; and
   a contactor formed on said dielectric substrate through a photolithography process, said contactor having a base portion vertically formed on said dielectric substrate at substantially right angle relative to said dielectric substrate, a horizontal portion in parallel with a surface of said dielectric substrate, one end of which being formed on said base portion, and a contact portion vertically formed on another end of said horizontal portion at substantially right angle relative to said horizontal portion;
   wherein said base portion, said horizontal portion and said contact portion are uniformly made of conductive material as a whole and are integral with one another and have substantially the same shape and size in cross section, and wherein said horizontal portion of said contactor is extended in a diagonal direction relative to a direction of the interconnect trace and produces a resilient contact force when said contactor is pressed against said contact target, and said contact portion of said contactor is sharpened at an end so that when said contactor is pressed against said contact target, it scrubs a surface of the contact target.

2. A probe contactor as defined in claim 1, further comprising an interconnect pad on said dielectric substrate which is electrically connected to said interconnect trace and said contactor.

3. A probe contactor as defined in claim 1, wherein said interconnect trace is made of metal and formed through either a deposition, evaporation, sputtering or plating process.

4. A probe contactor as defined in claim 1, wherein said contactor is directly formed on said interconnect trace to establish electrical connection therebetween.

5. A probe contactor as defined in claim 1, wherein said contactor is made of metal and formed through a deposition process after forming a photo mask on said interconnect trace.

6. A probe contactor as defined in claim 1, wherein said contactor is formed on said interconnect trace by repeating at least three photolithography processes, each of said photolithography processes includes steps of photoresist coating, masking, exposure, photoresist stripping and conductive material deposition.

7. A probe contactor for electrical connection with a contact target, comprising:
   a silicon substrate having an interconnect trace thereon which is an electric conductive path; and
   a contactor formed on said silicon substrate through a photolithography process, said contactor having a base portion vertically formed on said silicon substrate at substantially right angle relative to said silicon substrate, a horizontal portion in parallel with a surface of said silicon substrate, one end of which being formed on said base portion, and a contact portion vertically formed on another end of said horizontal portion at substantially right angle relative to said horizontal portion;
   wherein said base portion, said horizontal portion and said contact portion are uniformly made of conductive material as a whole and are integral with one another and have substantially the same square shape and size in cross section, and wherein said horizontal portion of said contactor is extended in a diagonal direction relative to a direction of the interconnect trace and produces a resilient contact force when said contactor is pressed against said contact target, and said contact portion of said contactor is sharpened at an end so that when said contactor is pressed against said contact target, it scrubs a surface of the contact target.

8. A probe contactor as defined in claim 7, further comprising an interconnect pad on said silicon substrate which is electrically connected to said interconnect trace and said contactor.

9. A probe contactor as defined in claim 7, wherein said interconnect trace is made of metal and formed through either a deposition, evaporation, sputtering or plating process.

10. A probe contactor as defined in claim 7, wherein said contactor is directly formed on said interconnect trace to establish electrical connection therebetween.

11. A probe contactor as defined in claim 7, wherein said contactor is made of metal and formed through a deposition process after forming a photo mask on said interconnect trace.

12. A probe contactor as defined in claim 7, wherein said contactor is formed on said interconnect trace by repeating at least three photolithography processes, each of said photolithography processes includes steps of photoresist coating, masking, exposure, photoresist stripping and conductive material deposition.

13. A method of producing a contactor for electrical connection with a contact target, comprising the following steps of:
   providing a substrate made of dielectric or semiconductor material;
   forming an interconnect trace on said substrate either by deposition or plating; and applying photolithography processes for forming a contactor having a base portion vertically formed on said interconnect trace at substantially right angle relative to said substrate, a horizontal portion in parallel with a surface of said substrate, one end of said horizontal portion being formed on said base portion, and a contact portion vertically formed on another end of said horizontal portion at substantially right angle relative to said horizontal portion, each of said photolithography processes including steps of photoresist coating, masking, exposure, photoresist stripping and conductive material deposition;

wherein said base portion, said horizontal portion and said contact portion are uniformly made of conductive material as a whole and integral with one another and have substantially the same square shape and size in cross section, and said horizontal portion is extended in a diagonal direction relative to a direction of the interconnect trace and produces a resilient contact force when pressed against the contact target, and said contact portion of said contactor is sharpened at an end so that when said contactor is pressed against said contact target, it scrubs a surface of the contact target.

* * * * *